(12) United States Patent
Wu

(10) Patent No.: US 8,179,735 B2
(45) Date of Patent: May 15, 2012

(54) USING DIFFERENTIAL SIGNALS TO READ DATA ON A SINGLE-END PORT

(75) Inventor: Jui-Jen Wu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 232 days.

(21) Appl. No.: 12/732,931

(22) Filed: Mar. 26, 2010

(65) Prior Publication Data

US 2011/0235448 A1 Sep. 29, 2011

(51) Int. Cl.
*G11C 7/00* (2006.01)
(52) U.S. Cl. .... 365/203; 365/205; 365/207; 365/185.05
(58) Field of Classification Search .................. 365/203, 365/205, 207, 185.05
See application file for complete search history.

(56) References Cited

U.S. PATENT DOCUMENTS

| | | | | |
|---|---|---|---|---|
| 7,277,339 B2* | 10/2007 | Edahiro | ........................ | 365/203 |
| 7,697,358 B2* | 4/2010 | Kajigaya | ........................ | 365/207 |
| 7,821,819 B2* | 10/2010 | Hachino | ........................ | 365/158 |
| 8,072,828 B2* | 12/2011 | Kajigaya | ........................ | 365/207 |
| 2008/0175040 A1* | 7/2008 | Kushida et al. | ................ | 365/154 |
| 2009/0019237 A1* | 1/2009 | Kwon et al. | ................... | 711/148 |
| 2009/0251947 A1* | 10/2009 | Kajigaya | ........................ | 365/149 |
| 2010/0061170 A1* | 3/2010 | Kajigaya | ........................ | 365/207 |

OTHER PUBLICATIONS

Chang, Leland et al., "A 5.3GHz 8T-SRAM with Operation Down to 0.41V in 65nm CMOS", 2007 Symposium on VLSI Circuits Digest of Technical Papers, pp. 252-253.

* cited by examiner

*Primary Examiner* — Tuan T. Nguyen
(74) *Attorney, Agent, or Firm* — Lowe Hauptman Ham & Berner, LLP

(57) ABSTRACT

In some embodiments related to reading data in a memory cell, the data is driven to a local bit line, which drives a local sense amplifier. Depending on the logic level of the data in the memory cell and thus the local bit line, the local sense amplifier transfers the data on the local bit line to a global bit line. A neighbor global bit line is used as a reference for a global sense amplifier to read the differential data on the global bit line and the neighbor global bit line.

20 Claims, 6 Drawing Sheets

USING DIFFERENTIAL SIGNALS TO READ DATA ON A SINGLE-END PORT

FIELD

The present disclosure is generally related to sensing (e.g., reading) data from a memory.

BACKGROUND

Single-end read bit-lines have been widely used for memory applications such as in 2-port static random access memory (SRAM), read-only memory (ROM), etc. In many approaches, a local sense amplifier (SA) senses data on a local bit-line (LBL) and drives the data to a global bit-line (GLB) for a global sense amplifier to read the data on the global bit-line. The global sense amplifier, however, uses full-swing large signals (e.g., rail-to-rail CMOS levels) to sense the global bit-line, which consumes large power and degrades read speeds. Further, the global bit-line is generally long and as a result is subject to heavy loading, which, together with the large-swing read further degrades the read speed.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
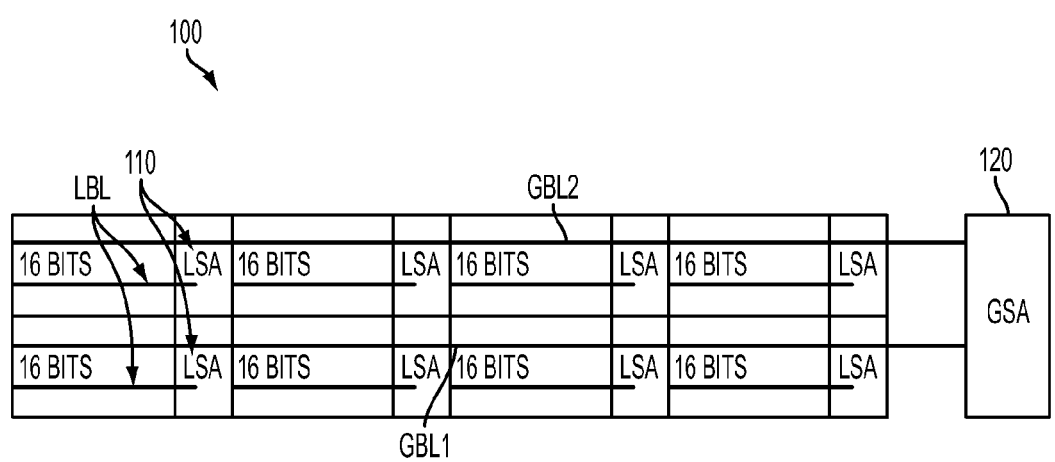
FIG. 1 is a schematic diagram of a memory array.

Embodiments, or examples, illustrated in the drawings are now being disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Exemplary Memory Array

FIG. 1 is a schematic diagram of an exemplary memory array 100.

Memory array 100 includes a plurality of cells (e.g., bits, or memory bits or memory cells) wherein a group of cells (e.g., 16 cells, 32 cells, 64 cells, etc.) is coupled to a local bit line (LBL) and a local sense amplifier (LSA) 110. For illustration, a group of cells in FIG. 1 comprises 16 bits or 16 cells. Each LSA 110 is coupled to a global bit line (e.g., GBL1, GBL2). A pair of global bit lines (e.g., GBL1 and GBL2) is coupled to a global sense amplifier (GSA) 120. In some embodiments, memory array 100 can have more than one pair of global bit lines, but is shown with only one pair of GBL1 and GBL2 for illustration.

Figure 3:
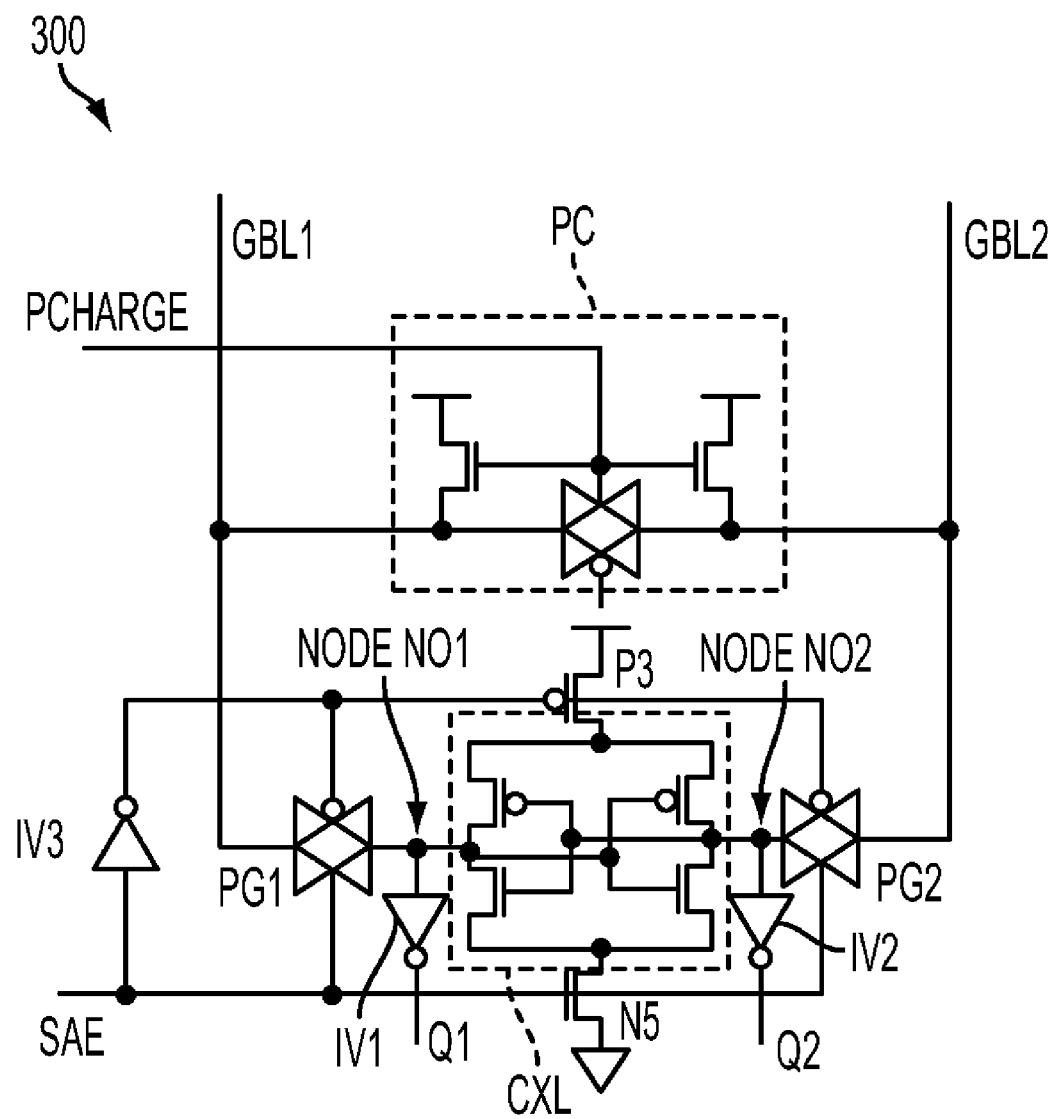
FIG. 3 is a schematic diagram of a circuit illustrating using a global sense amplifier to sense the differential signal between the generated voltage on the global bit line of FIG. 2 and a reference voltage of a neighbor global bit line, in accordance with some embodiments.

In some embodiments, when a memory cell is read, the data in that memory cell is driven to the corresponding local bit line LBL based on which the corresponding LSA 110 generates the data on the corresponding global bit line (e.g., GBL1, in FIG. 3). The global bit line having the data generated by LSA 110 (e.g., GBL1) and a neighbor global bit line (e.g., GBL2, in FIG. 3) having a reference voltage constitute a differential signal based on which the data in the memory cell is read by GSA 120.

Generating the Data on a Global Bit Line

Figure 2:
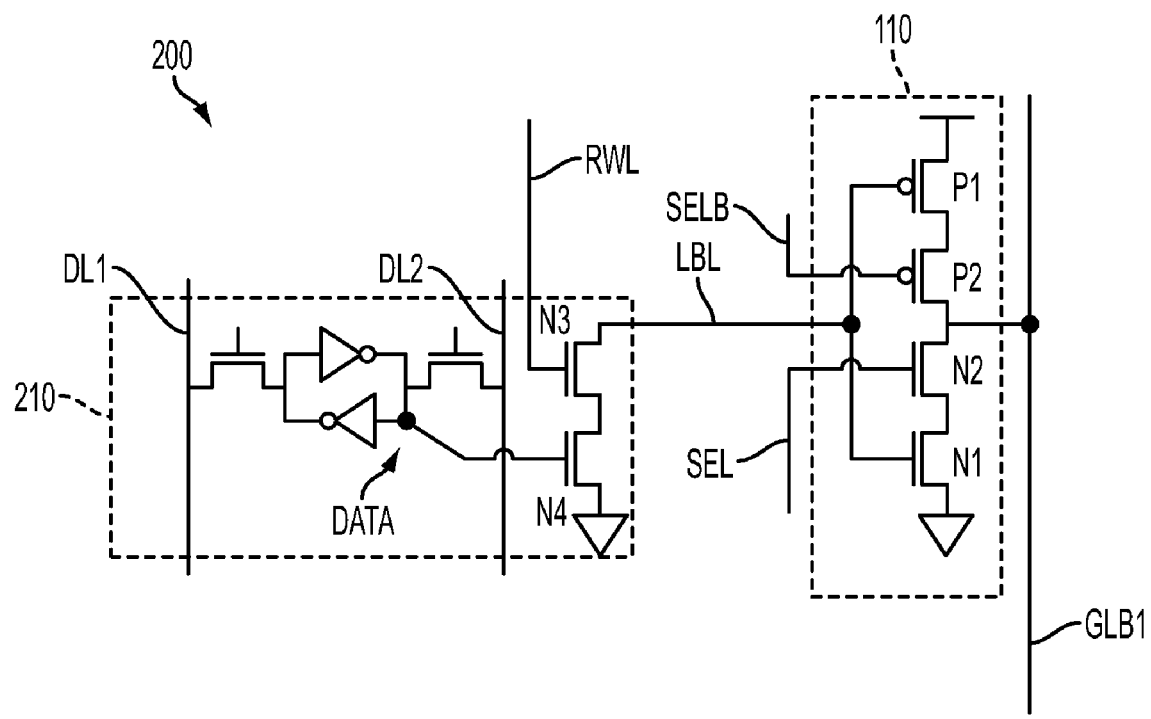
FIG. 2 is a schematic diagram of a circuit illustrating generating a voltage level on a global bit line based on the logic level of a local bit line, in accordance with some embodiments.

FIG. 2 is a schematic diagram of a circuit 200 illustrating an LSA 110 uses the data on a local bit line LBL to generate the data/voltage level on a global bit line (e.g., GLB1), in accordance with some embodiments.

Memory cell 210 is a 2-port 8T with a single-ended read port commonly known in the art. The term "2-port" refers to two data lines DL1 and DL2 from which data are written to memory cell 210. Data lines DL1 and DL2 are coupled to a plurality of memory cells 210 (e.g., 16 as illustrated in FIG. 1), but, for illustration, only one memory cell 210 is shown coupled to data lines DL1 and DL2 in FIG. 2. The term "8T" refers to 8 transistors (not completely shown) forming the memory cell 210, and the term "single-ended read port" refers to one local bit line LBL from which data of memory cell 210 is read. The local bit line LBL (or read port) is also commonly called a read bit line (e.g., RBL). Some details of memory cell 210 are shown for illustration only, and any other memory cells are within the scope of the various embodiments.

Node Data stores data for memory cell 210. In some embodiments, before the data in memory cell 210 is read, local bit line LBL is charged to a high logic level (e.g., towards Vdd (HIGH)) by a circuit (not shown). When the data is read, signal read word line RWL is activated (e.g., driven HIGH) and applied to the gate of transistor N3 to turn on transistor N3. If node Data is HIGH, transistor N4 is on. Because transistors N3 and N4 are on, transistors N3 and N4 pull line LBL to the source of transistor N4, which is at a low voltage level (LOW). If node Data is LOW, transistor N4 is off, line LBL remains at the HIGH level pre-charged before reading.

Further, in the read cycle, signal SEL is activated HIGH and applied to the gate of transistor N2 to turn on transistor N2. At the same time, signal SELB, the inverse logic of signal SEL, is activated LOW and applied to the gate of transistor P2 to turn on transistor P2. If line LBL is LOW, transistor P1 is on while transistor N1 is off. Because transistors P1 and P2 are on, the operation voltage Vdd at the drain of transistor P1 via transistors P1 and P2 pulls line GLB1 to a HIGH. If line LBL is HIGH, however, transistor N1 is on while transistor P1 is off. Because transistors N1 and N2 are on, transistors N1 and N2 pull line GBL1 to the level at the source of transistor N1, which is ground or LOW.

From the above illustration, if node Data stores a LOW, when reading, line GBL1 is LOW, but if node Data stores a HIGH, line GBL1 is HIGH. The pair of transistors P1 and P2 can be called a charging pair because they pull (e.g., charge) line GBL1 to a HIGH when appropriate. Similarly, the pair of transistors N1 and N2 can be called a pull-down pair because they pull line GBL1 to a LOW when appropriate. LSA 110 and memory cell 210 are shown for illustration only. Comparable circuits that can generate the voltage/logic level for line GBL1 are within the scope of the various embodiments. In some embodiments, LSA 110 (and/or comparable circuits) can be referred to as a transfer circuit because LSA transfer the logic data stored in memory cell 210 to global bit line GLB1.

Using the Global Sense Amplifier to Read the Global Bit Line

FIG. 3 is a schematic diagram of a circuit 300 (e.g., GSA 300) illustrating the operation of a global sense amplifier GSA 120 after the voltage level of a global bit line (e.g., line GLB1) has been charged/discharged according to the logic level of the local bit line LBL. In this illustration, a second global bit line (e.g., GBL2) having a voltage as reference is selected for the global sense amplifier GSA 300 to sense/read the differential signal on the global bit lines GBL1 and GBL2 to provide the reading data corresponding to the data stored in the memory cell to be read. In some embodiments, before the voltage level on GBL1 is generated, lines GBL1 and GBL2 are (pre-)charged to about Vdd/2, and this Vdd/2 on line GBL2 is used as a reference. If the data in memory cell 210 is low, LSA 110 pulls line GBL1 to a LOW (e.g., ground at the source of transistor N1), but if the data in memory cell 210 is HIGH, LSA 110 pulls ling GBL1 to Vdd (e.g., the operation voltage at the drain of transistor P1).

Before sensing/reading, signal SAE is deactivated (e.g., driven low) to turn off transistors P3 and N5. Global bit-lines GBL1 and GBL2 are pre-charged to a predetermined voltage level by a pre-charge circuit PC. In at least one embodiment, global bit-lines GBL1 and GBL2 are pre-charged to one-half of the VDD. Later, the voltage level of the selected global bit-ling will go higher or lower than the pre-charged voltage level according to the stored data, and the unselected global bit-line remains at the pre-charged voltage level and will act as a reference voltage.

The data on lines GBL1 and GBL2 are transferred via pass gates PG1 and PG2 to nodes NO1 and NO2. Signal SAE is then activated (e.g., driven HIGH) to turn on transistors P3 and N5 for GSA 300 to sense the differential signal on lines GBL1 and GBL2 (or nodes NO1 and NO2). In the example of reading a HIGH (e.g., the data stored in memory cell 210 is HIGH), because line GBL1 is pulled HIGH by LSA 110 and line GBL2 remains at the pre-charged level as a reference, the small voltage difference between lines GBL1 and GLB2 is developed and passed into nodes NO1 and NO2. Once signal SAE is activated to turn on transistors P3 and N5 for sensing, GSA 300 amplifies the differential signal at nodes NO1 and NO2 to a full level voltage, which results in a LOW at node Q1 via inverter IV1 and a HIGH at node Q2 via inverter IV2. The data at nodes Q1 and Q2 are then driven to an output buffer (not shown) as reading a HIGH data. If the data in the memory cell 210 is, however, LOW, the voltage level on line GBL1 is LOW, GSA 300, sensing GBL1 having a voltage level lower than that of GBL2, provides a HIGH at node Q1 and a low at node Q2, which are driven to the output buffer as reading a LOW data.

Because GSA 300 uses the differential signal between lines GBL1 and GBL2, circuit 100 including circuits 200 and 300 consumes less power than had it used the full large signal. The sensing/reading speed is also faster. Similarly, when reading a data stored in a memory cell coupled to a LSA 110 connected to GBL2, GBL1 can provide the reference voltage and voltage on the LSA 110 can be transferred to GBL2.

In the above illustration, a neighbor global bit line of global bit line GBL1 (e.g., global bit line GBL2) is chosen as a reference bit line, other global bit lines that are not neighbors can be used. Further, when a global bit line is used as a reference (e.g., global bit line GBL2), all LSA 110 coupled to global bit line GBL2 are electrically disconnected from that GBL2. In some embodiments, all signals SEL controlling those LSA 110 are driven LOW, and the corresponding signals SELB are driven HIGH. In some embodiments, a line having a voltage (e.g., Vdd/2) is used as a reference line in place of a global bit line (e.g., GBL2).

Illustrative Method

Figure 4:
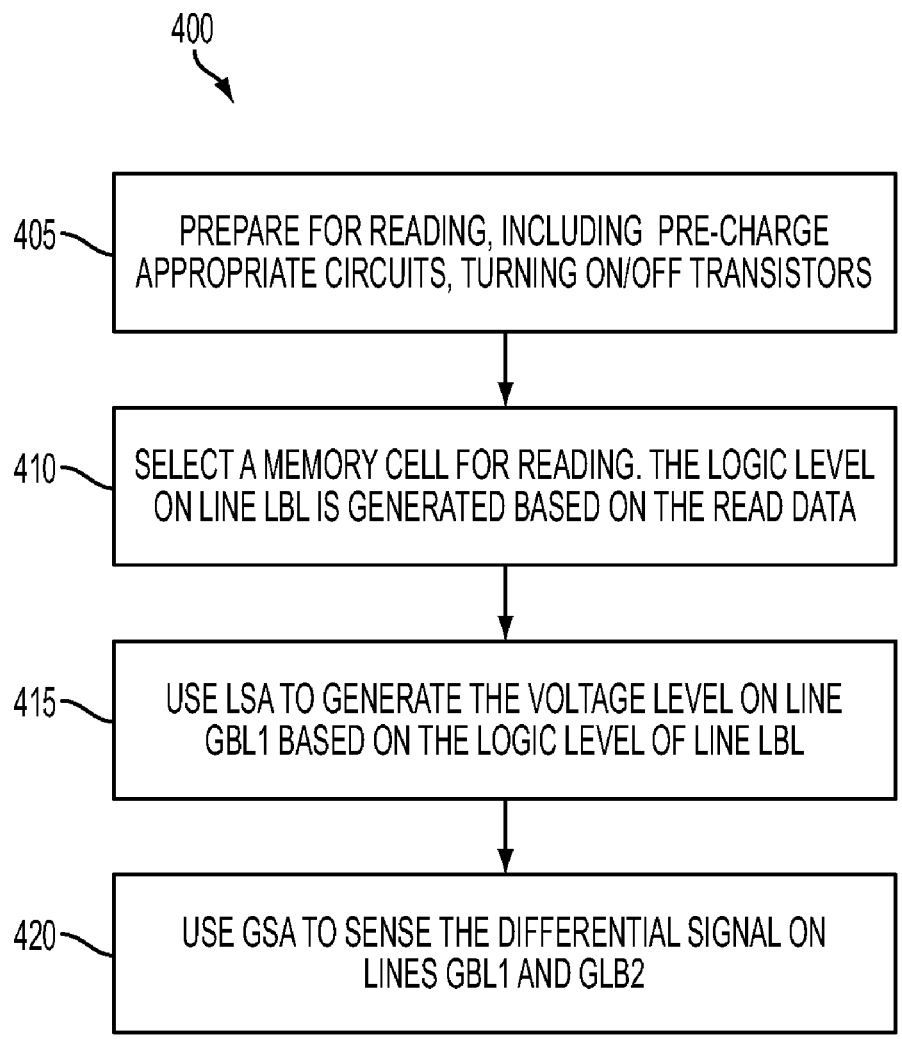
FIG. 4 is a flowchart of a method illustrating a read operation of the circuits in FIGS. 1-3, in accordance with some embodiments.

FIG. 4 is a flowchart of a method 400 illustrating a read operation of circuit 100 including circuits 200 and 300, in accordance with some embodiments.

In step 405, reading a memory cell (e.g., memory cell 210) is prepared. T Local bit line LBL is precharged to a HIGH logic level (e.g., towards Vdd). Signal PCHARGE is activated to pre-charge lines GBL1 and GBL2 to Vdd/2, and signal SAE is deactivated to turn off transistors N5 and P3 in GSA 300 (FIG. 3).

In step 410, memory cell 210 is selected for reading. Signal RWL is activated to turn on transistor N3. Because transistor N3 is on, local bit line LBL is driven by the data stored in node Data. For illustration, the stored data is HIGH, which turns on transistor N4, allowing transistors N3 and N4 to pull line LBL to a LOW, which turns on transistor P1.

In step 415, local sense amplifier 110 is used to generate the voltage level on line GBL1 based on the data on line LBL. Signals SEL and SELB are activated to turn on transistors N2 and P2 in LSA 110. Because transistors P1 and P2 are on, transistors P1 and P2 pull line GBL1 towards the Vdd at the drain of transistor P1. Line GBL1 is therefore HIGH.

In step 420, global sense amplifier GSA 300 is used to sense the differential signal on lines GBL1 and GLB2 wherein GBL2 is at Vdd/2 as a voltage reference. The difference in the voltage levels between line GBL1 and GBL2 enable GSA 300 to sense/provide the read data. Stated another way, the singled-ended read data at local bit line LBL has been transformed to the differential data on lines GBL1 and GBL2 to be sensed/read by GSA 300. Signal SAE is then activated, which allows pass gates PG1 and PG2 to transfer the data on lines GBL1 and GBL2 to nodes NO1 and NO2 and turns on transistors N5 and P3 for GSA 300 to start sensing. Because, for illustration, the voltage level on line GBL1 (or node NO1) at Vdd is higher than the voltage level on line GBL2 (or node NO2) at Vdd/2, GSA 300 provides a LOW and HIGH to the respective nodes Q1 and Q2, which is driven to the output buffer for reading.

Illustrative Waveforms

Figure 5:
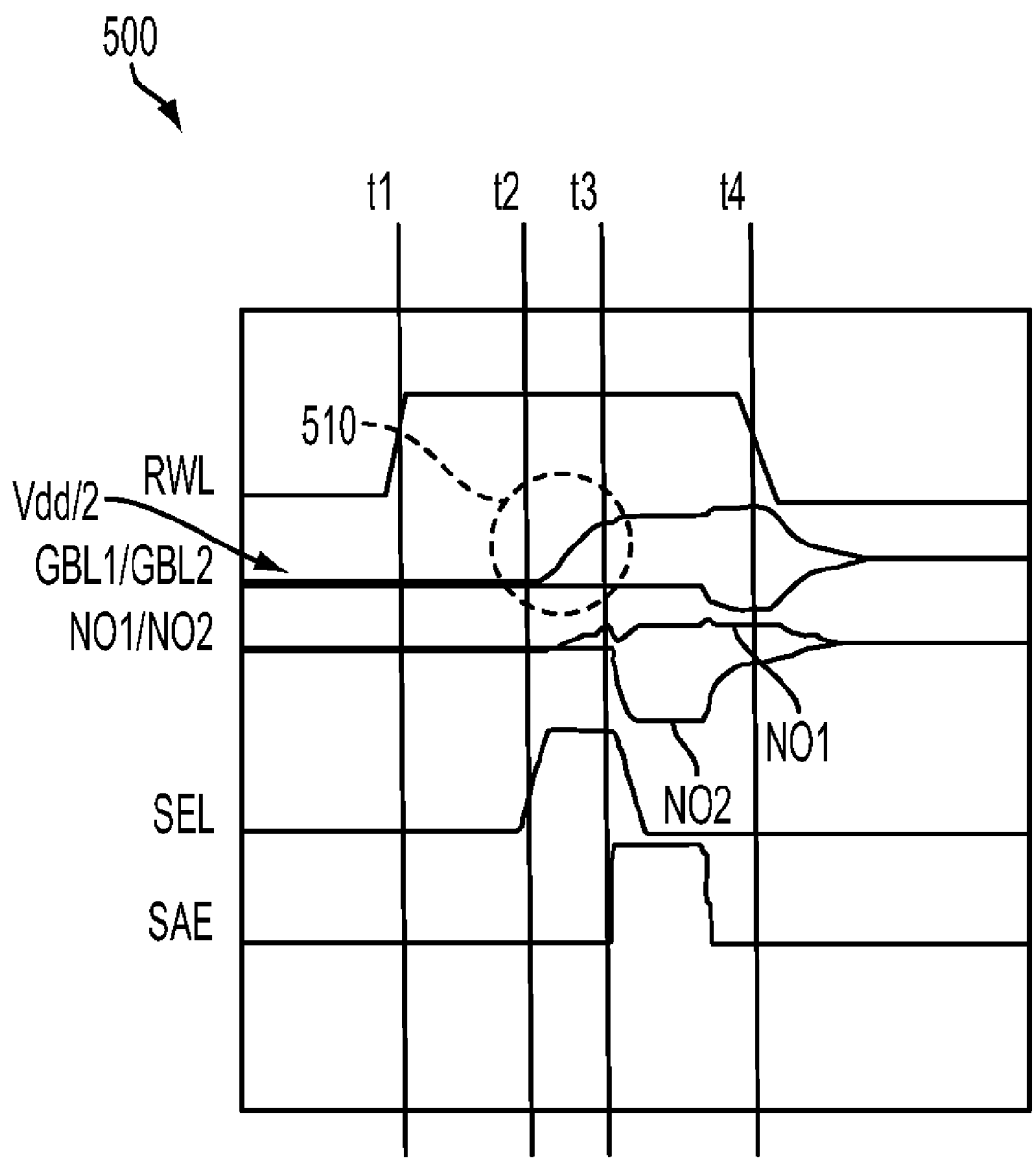
FIG. 5 is a graph showing waveforms illustrating reading a HIGH data, in accordance with some embodiments.

FIG. 5 is a graph of waveforms 500 illustrating reading a HIGH in memory cell 210, in accordance with some embodiments.

At time t1, read word line RWL is driven high to start a read cycle for memory cell 210, and, at time t4, is driven low to end the read cycle.

Before time t2, both lines GBL1 and GBL2 are charged to Vdd/2. At time t2 signal SEL is driven HIGH so that the voltage level at line GBL1 is charged/discharged to a higher/ lower voltage level based on the logic level of local bit line LBL. Because in this illustration the data in memory cell 210 is HIGH, the logic level on line GBL1 is pulled to the drain of transistor P1, which is shown in circle 510 as rising from Vdd/2 towards Vdd.

At time t3 signal SAE is driven high for GSA 300 to sense the data. The voltage difference between lines GLB1 and GBL2 (e.g., the differential signal) is passed to nodes NO1 and NO2. While signal SAE is activated sense amplifier 300 amplifies the voltage difference at nodes NO1 and NO2 to a full level voltage signal where NO1 is HIGH and NO2 is LOW, and driven to the output buffer for reading (not shown). Signal SAE is then driven LOW to end the sensing function.

Figure 6:
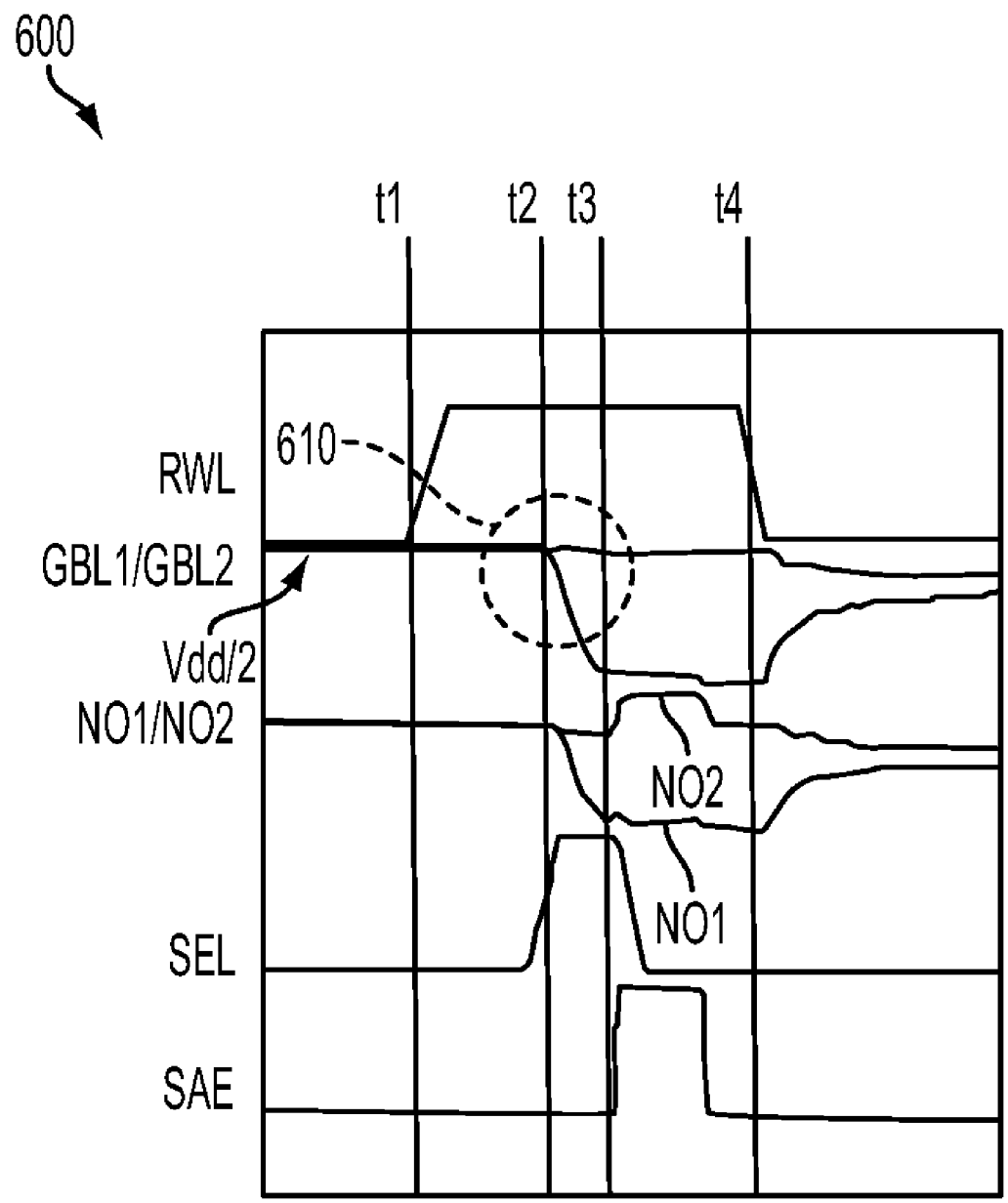
FIG. 6 is a graph showing waveforms illustrating reading a LOW data, in accordance with some embodiments.

FIG. 6 is a graph of waveforms 600 illustrating reading a LOW in memory cell 210, in accordance with some embodiments.

Similar to FIG. 5, at time t1, read word line RWL is driven HIGH to start a read cycle for memory cell 210, and, at time t4, is driven LOW to end the read cycle.

Before time t2, both lines GBL1 and GBL2 are charged to Vdd/2. At time t2 signal SEL is driven high so that the voltage level at line GBL1 is generated based on the logic level of local bit line LBL. Because in this illustration the data in memory cell 210 is LOW, the logic level on line GBL1 is pulled to the source of transistor P2, which is shown in circle 610 as falling from Vdd/2 towards ground.

At time t3 signal SAE is driven high for GSA 300 to sense the data. The voltage difference between lines GLB1 and GBL2 (e.g., the differential signal) is amplified and passed to nodes NO1 and NO2. While signal SAE is activated sense amplifier 300 amplifies the voltage difference at nodes NO1 and NO2 to a full level voltage signal where NO1 is LOW and NO2 is HIGH, and driven to the output buffer for reading (not shown). Signal SAE is then driven LOW to end the sensing function.

A number of embodiments have been described. It will nevertheless be understood that various modifications may be made without departing from the spirit and scope of the present disclosure. For example, the method example was described with exemplary steps, which are not necessarily performed in the order as explained. Steps may be added, replaced, changed in order, and/or eliminated as appropriate, in accordance with the spirit and scope of this disclosure. The various transistors being shown as a particular dopant type (e.g., NMOS and PMOS) are for illustration purposes, embodiments of the disclosed embodiments are not limited to a particular type, but the dopant type selected for a particular transistor is a design choice and is within the scope of the embodiments. The logic level (e.g., low or high) of the various signals used in the above description is also for illustration purposes, embodiments of the disclosures are not limited to a particular level when a signal is activated and/or deactivated, but, rather, selecting such a level is a matter of design choice and is within the scope of the invention.

Each claim of this disclosure constitutes a separate embodiment, and embodiments that combine different claims and/or different embodiments are within scope of the invention and will be apparent to those of ordinary skill in the art after reviewing this disclosure.

What is claimed is:

1. A memory array comprising:
   a local bit line electrically coupling a memory cell and a transfer circuit;
   a first global bit line electrically coupling the transfer circuit and a global sense amplifier;
   wherein in reading data in the memory cell
   a logic level of the local bit line is generated based on the data stored in the memory cell;
   the transfer circuit is configured to charge or discharge the first global bit line to a voltage level based on the logic level of the local bit line; and
   the global sense amplifier is configured to receive the voltage level of the first global bit line and a reference voltage level to generate read data that reflects the data in the memory cell.

2. The memory array of claim 1 wherein the reference voltage level is from a second global bit line of the memory array.

3. The memory array of claim 1 wherein, in reading the data in the memory cell, the logic level of the local bit line is charged or discharged further based on a logic level provided to the local bit line.

4. The memory array of claim 1 wherein
   the transfer circuit comprises
   a first PMOS transistor coupled in series to a second PMOS transistor; and
   a first NMOS transistor coupled in series to a second NMOS transistor; the second PMOS transistor coupled to the second NMOS transistor; and
   the logic level of the local bit line controls the first PMOS transistor and the first NMOS transistor.

5. The memory array of claim 1 wherein in reading the data in the memory cell if the data in the memory cell is at a first logic level, the logic level of the local bit line is configured to be at a second logic level different from the first logic level, and the voltage level of the first global bit line is configured to be at a first logic level.

6. The memory array of claim 1 wherein, in reading the data in the memory cell, the local bit line is charged to a high logic level before the logic level of the local bit line is charged or discharged.

7. The memory array of claim 1 wherein, in reading the data in the memory cell, the first global bit line is charged to about 50% of an operation voltage of the memory array before the voltage level of the first global bit line is charged or discharged based on the logic level of the local bit line, and the reference voltage level is about 50% of the operation voltage of the memory array.

8. A memory array comprising:
   at least two first local bit lines coupled to at least two first groups of memory cells and to at least two first transfer circuits;
   a first global bit line coupling the at least two first transfer circuits;
   at least two second local bit lines coupled to at least two second groups of memory cells and to at least two second transfer circuits;
   a second global bit line coupling the at least two second transfer circuits;
   wherein in reading data of a memory cell in the at least two first groups of memory cells or in the at least two second groups of memory cells;
   a local bit line and a transfer circuit corresponding to the memory cell are configured to generate a first voltage level on a third global bit line coupled to the circuit corresponding to the memory cell based on the data of the memory cell;
   a fourth global bit line different from the third global bit line and having a second voltage level as a reference, and a global sense amplifier coupled to the third global bit line are configured to sense a difference between the first voltage level and the second voltage level to provide data that reflects the data of the memory cell; the first voltage level being different from the second voltage level;

the third global bit line is selected from a group consisting of the first global bit line and the second global bit line;

the fourth global bit line is selected from a group consisting of the first global bit line, the second global bit line, and a fifth global bit line different from the first global bit line and the second global bit line.

9. The memory array of claim 8 wherein, in reading the data of the memory cell, the local bit line is pre-charged to a high logic level; and the third global bit line and the fourth global bit line are pre-charged to about 50% of an operation supply voltage of the memory array.

10. The memory array of claim 8 wherein a logic level of the local bit line controls transistors in the transfer circuit to generate the first voltage level.

11. The memory array of claim 10 wherein the transistors include a first PMOS transistor and a first NMOS transistor; the first PMOS transistor coupled to a second PMOS transistor; the first NMOS transistor coupled to a second NMOS transistor; the second PMOS transistor coupled to the second NMOS transistor.

12. The memory array of claim 10 wherein the logic level of the local bit line is generated based on the data of the memory cell.

13. The memory array of claim 8 wherein when the data of the memory cell is at a first logic level, the local bit line is configured to be at a second logic level different from the first logic level, and the first voltage level is at the first logic level.

14. A memory array comprising:

a first PMOS transistor coupled in series with a second PMOS transistor;

a first NMOS transistor coupled in series with a second NMOS transistor;

the second PMOS transistor coupled in series with the second NMOS transistor;

a local bit line coupled to a gate of the first PMOS transistor and to a gate of the first NMOS transistor;

a global bit line of the memory array coupled to a source of the second PMOS transistor and to a drain of the second NMOS transistor;

a third NMOS transistor coupled in series with a fourth NMOS transistor; a drain of the third NMOS transistor coupled to the local bit line; a gate of the fourth NMOS transistor coupled to a node of a memory cell of the memory array;

a sense amplifier coupled to the global bit line;

wherein in reading data stored in the node of the memory cell the local bit line is charged to a high logic level;

the third NMOS transistor and the fourth PMOS transistors are configured to turn on and cause a logic level on the local bit line based on the charged high logic level of the local bit line and on the data stored on the node of the memory cell;

the logic level on the local bit line controls the first PMOS transistor and the first NMOS transistor to generate a voltage level on the global bit line;

the sense amplifier is configured to sense the voltage level of the global bit line and a reference voltage to provide read data that reflects the data stored on the node of the memory cell.

15. The memory array of claim 14 wherein the reference voltage is provided to a second global bit line of the memory array.

16. The memory array of claim 14 wherein when the data stored on the node of the memory cell is at a first logic level, the logic level of the local bit line is configured to be at a second logic level different from the first logic level, and the voltage level on the global bit line is configured to be at the first logic level.

17. A method comprising:

selecting a memory cell of a memory array for reading data in the memory cell;

based on the data in the memory cell, generating a logic level on a local bit line corresponding to the memory cell;

based on the logic level generated on the local bit line, generating a voltage level on a global bit line of the memory array;

selecting a reference voltage level; and using a sense amplifier to sense a difference in the voltage level generated on the global bit line and the reference voltage level to provide read data that reflects the data in the memory cell.

18. The method of claim 17 further comprising using a second global bit line of the memory array to provide the reference voltage level.

19. The method of claim 17 further comprising charging the local bit line before generating the logic level on the local bit line.

20. The method of claim 17 further comprising charging the global bit line to the reference voltage level before generating the voltage level on the global bit line.

* * * * *